(12) United States Patent
Lin

(10) Patent No.: US 10,250,189 B1
(45) Date of Patent: Apr. 2, 2019

(54) SINGLE SIDEBAND MIXER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/111,315

(22) Filed: Aug. 24, 2018

(51) Int. Cl.
H03D 7/14 (2006.01)
(52) U.S. Cl.
CPC .................... H03D 7/1441 (2013.01)
(58) Field of Classification Search
CPC ................ H03D 7/14; H03D 7/1441
See application file for complete search history.

(56) References Cited

U.S. PATENT DOCUMENTS

2008/0068052 A1* 3/2008 Tsai ............... H03B 19/14
327/116

* cited by examiner

*Primary Examiner* — Daniel C Puentes
(74) *Attorney, Agent, or Firm* — McClure, Qualey & Rodack, LLP

(57) ABSTRACT

A circuit having a first Gilbert cell mixer of a first type configured to receive phases of first and second signals and output a first current pair to a first node and a second node; a first Gilbert cell mixer of a second type configured to receive output a second current pair to the first node and the second node; a second Gilbert cell mixer of the first type configured to receive phases of the first and second signals and output a third current pair to the first node and the second node; a second Gilbert cell mixer of the second type configured to output a fourth current pair to the first node and the second node; a cross-coupling inverter pair configured to cross couple the first node and the second node; and a load placed across the first node and the second node and configured to resonate at a frequency approximately equal to either a sum of a frequency of the first signal and a frequency of the second signal or a difference of the frequency of the first signal and the frequency of the second signal.

20 Claims, 4 Drawing Sheets

SINGLE SIDEBAND MIXER AND METHOD THEREOF

BACKGROUND OF THE INVENTION

Field of the Invention

The present invention generally relates to single sideband mixers and more particularly to single sideband mixers that can use direct current coupling to interface with the subsequent circuit.

Description of Related Art

A conventional single sideband (hereafter SSB) mixer receives a first signal of a first frequency and a second signal of a second frequency and outputs a third signal of a third frequency that is a sum of the first frequency and the second frequency. In a differential signaling embodiment, both the first signal and the second signal are four-phase signals, while the third signal is a two-phase signal. A schematic diagram of a prior art SSB mixer 100 is depicted in FIG. 1. SSB mixer 100 receives a first signal X and a second signal Y and output a third signal Z, wherein: the first signal X is a four-phase signal comprising a first phase $X_1$, a second phase $X_2$, a third phase $X_3$, and a fourth phase $X_4$; the second signal Y is a four-phase signal comprising a first phase $Y_1$, a second phase $Y_2$, a third phase $Y_3$, and a fourth phase $Y_4$; and the third signal Z is a two-phase signal comprising a first phase $Z_1$ a second phase $Z_2$. SSB 100 comprises a first Gilbert cell mixer 110, a second Gilbert cell mixer 120, and a load 130, wherein: the first Gilbert cell mixer 110 comprises six NMOS (n-channel metal oxide semiconductor) transistors 111, 112, 113, 114, 115, and 116 and is configured to mix $X_1$ and $X_3$ with $Y_1$ and $Y_3$, resulting in a first current pair $I_1$ and $I_2$; the second Gilbert cell mixer 120 comprises six NMOS transistors 121, 122, 123, 124, 125, and 126 and is configured to mix $X_2$ and $X_4$ with $Y_2$ and $Y_4$, resulting in a second current pair $I_3$ and $I_4$; the load 130 comprises a first inductor 131, a second inductor 132, and a capacitor 133. Throughout this disclosure, "$V_{DD}$" denotes a power supply node, and "$V_{SS}$" denotes a ground node. The first signal X is of a first frequency $f_1$, and the second signal Y is of a second frequency $f_2$. $I_1$ and $I_4$ are summed at a first node 101, resulting in $Z_1$; $I_2$ and $I_3$ are summed at a second node 102, resulting in $Z_2$. The load 130 forms a resonant tank of a resonant frequency equal to $f_1+f_2$, so that a dominant component of the third signal Z is of the frequency $f_1+f_2$. Gilbert cell mixers are well known in the prior art, so is SSB mixer 100; therefore, there is no need to describe them in detail here.

It is highly desirable that a preceding circuit (which is usually a buffer) and a subsequent circuit (which is also usually a buffer) of SSB mixer 100 also operate at the same power domain, i.e. receiving power from $V_{DD}$ and returning through $V_{SS}$, otherwise the complexity of the overall system will be greater. A first issue of SSB mixer 100 is, a common-mode voltage of the third signal Z is equal to $V_{DD}$ and is most likely too high for the subsequent circuit and therefore AC (alternate current) coupling is needed to interface with the subsequent circuit. A second issue of SSB mixer 100 is, $Z_1$ and $Z_2$ can swing to a level that can damage NMOS transistors 113~116 and 123~126, therefore some protection circuits, e.g. cascode devices inserted between the load 130 and the two Gilbert cell mixers 110 and 120, are needed.

What is desired is a SSB mixer that can use DC (direct current) coupling to interface with the subsequent circuit and do not need protection circuits.

BRIEF SUMMARY OF THIS INVENTION

In an embodiment, a circuit comprises: a first Gilbert cell mixer of a first type configured to receive a first phase and a third phase of a first signal and a first phase and a third phase of a second signal and output a first current pair to a first node and a second node; a first Gilbert cell mixer of a second type configured to receive the first phase and the third phase of the first signal and the first phase and the third phase of the second signal and output a second current pair to the first node and the second node; a second Gilbert cell mixer of the first type configured to receive a second phase and a fourth phase of the first signal and a second phase and a fourth phase of the second signal and output a third current pair to the first node and the second node; a second Gilbert cell mixer of the second type configured to receive the second phase and the fourth phase of the first signal and the second phase and the fourth phase of the second signal and output a fourth current pair to the first node and the second node; a cross-coupling inverter pair configured to cross couple the first node and the second node; and a load placed across the first node and the second node and configured to resonate at a frequency approximately equal to either a sum of a frequency of the first signal and a frequency of the second signal or a difference of the frequency of the first signal and the frequency of the second signal.

In an embodiment, a method comprises: receiving a first signal comprising four phases and a second signal comprising four phases; using a first Gilbert cell mixer of a first type to generate a first current pair by mixing a first phase and a third phase of the first signal with a first phase and a third phase of the second signal; using a first Gilbert cell mixer of a second type to generate a second current pair by mixing the first phase and the third phase of the first signal with the first phase and the third phase of the second signal; using a second Gilbert cell mixer of the first type to generate a third current pair by mixing a second phase and a fourth phase of the first signal with a second phase and a fourth phase of the second signal; using a second Gilbert cell mixer of the second type to generate a fourth current pair by mixing the second phase and the fourth phase of the first signal with the second phase and the fourth phase of the second signal; summing the first current pair, the second current pair, the third current pair, and the fourth current pair to form a third signal of two phases at a first node and a second node; cross coupling a first phase and a second phase of the third signal using an inverter pair; and filtering the third signal using a resonant network across the first node and second node.

DETAILED DESCRIPTION OF THIS INVENTION

The present invention relates to single sideband mixers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "circuit," "load," "voltage," "current," "resistor," "capacitor," "low-pass filter," "transistor," "MOS (metal-oxide semiconductor)," "PMOS (p-channel metal oxide semiconductor)," "NMOS (n-channel metal oxide semiconductor)," "CMOS (complementary metal oxide semiconductor)," "node," "power supply "source," "gate," "drain," "ground node," "power node," "frequency," "single sideband," "mixer," "switch," "resonant tank," and "cascode." Those of ordinary skill in the art can also readily recognize a symbol of a MOS transistor, and its associated "source," "gate," and "drain" terminals. Terms and basic concepts like these are apparent to those of ordinary skill in the art and thus will not be explained in detail here.

Figure 2A:
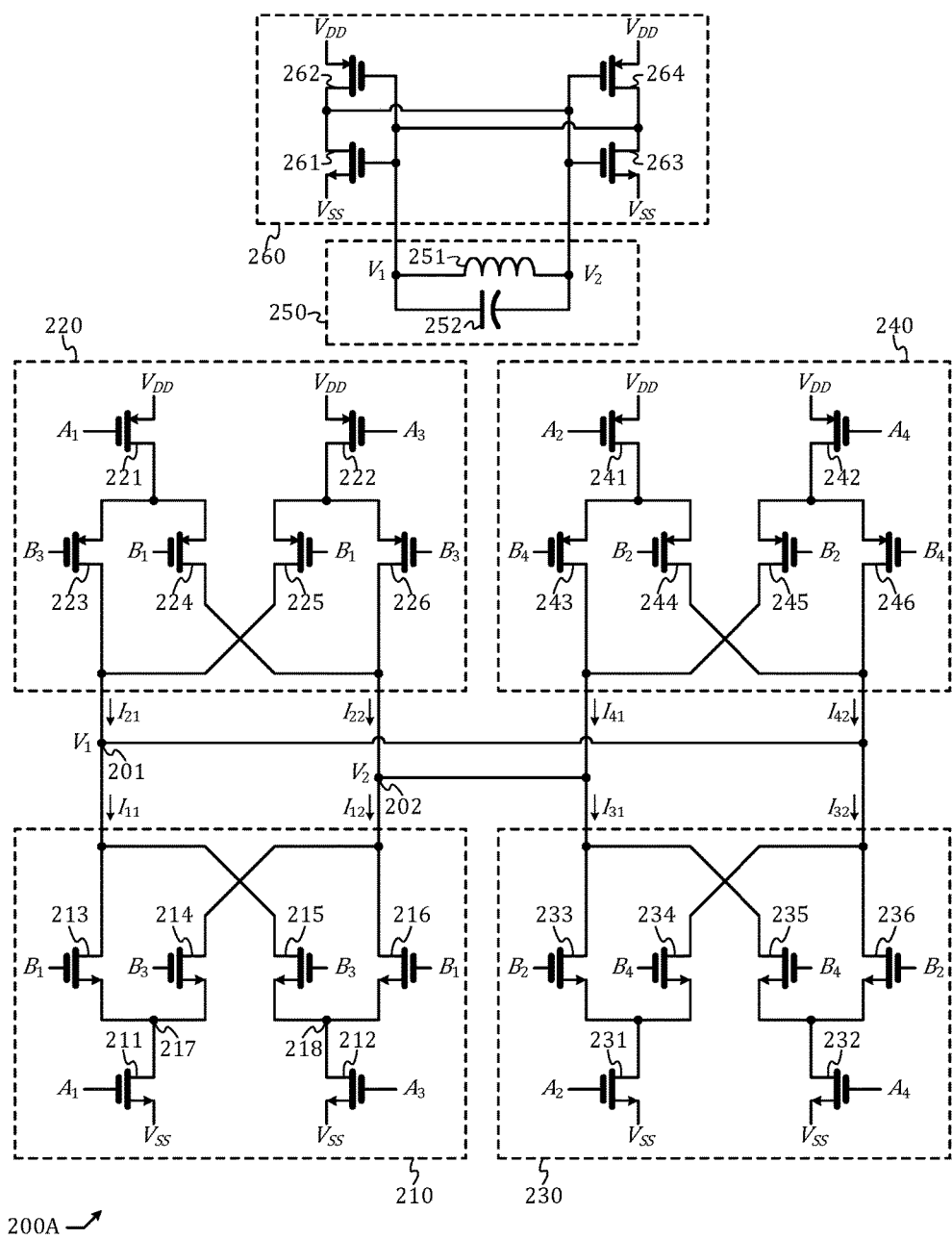
FIG. 2A shows a schematic diagram of a single sideband mixer in accordance with an embodiment of the present invention.

A schematic diagram of a single sideband (SSB) mixer 200A in accordance with an embodiment of the present invention is depicted in FIG. 2A. SSB mixer 200A receives a first signal A and a second signal B and output a third signal V, wherein: the first signal A is a four-phase signal comprising a first phase $A_1$, a second phase $A_2$, a third phase $A_3$, and a fourth phase $A_4$; the second signal B is a four-phase signal comprising a first phase $B_1$, a second phase $B_2$, a third phase $B_3$, and a fourth phase $B_4$; and the third signal V is a two-phase signal comprising a first phase $V_1$ a second phase $V_2$. SSB mixer 200A comprises a first N-type Gilbert cell mixer 210, a first P-type Gilbert cell mixer 220, a second N-type Gilbert cell mixer 230, a second P-type Gilbert cell mixer 240, a cross-coupling inverter pair 260, and a load 250, wherein: the first N-type Gilbert cell mixer 210 comprises six NMOS (n-channel metal oxide semiconductor) transistors 211, 212, 213, 214, 215, and 216; the first P-type Gilbert cell mixer 220 comprises six PMOS (p-channel metal oxide semiconductor) transistors 221, 222, 223, 224, 225, and 226; the second N-type Gilbert cell mixer 230 comprises six NMOS transistors 231, 232, 233, 234, 235, and 236; the second P-type Gilbert cell mixer 240 comprises six PMOS transistors 241, 242, 243, 244, 245, and 246; the load 250 comprises an inductor 251 and a capacitor 252; and the cross-coupling inverter pair 260 comprising a first inverter made up of NMOS transistor 261 and PMOS transistor 262 and a second inverter made up of NMOS transistor 263 and PMOS transistor 264. Those of ordinary skills in the art understand MOS transistor symbols and circuit diagrams, therefore a detailed description of connection (for instance, the source, the gate, and the drain of NMOS transistor 211 connect to $V_{SS}$, $A_1$, and node 217, respectively) is not provided. Each Gilbert cell mixer (i.e. 210, 220, 230, and 240) comprises two gain devices controlled by two phases of the first signal A and four switches controlled by two phases of the second signal B.

For instance, the first N-type Gilbert cell 210 two gain devices embodied by NMOS transistors 211 and 212 controlled by $A_1$ and $A_3$, respectively, and four switches 213, 214, 215, and 216 controlled by $B_1$, $B_3$, $B_3$, and $B_1$, respectively. The first N-type (P-type) Gilbert cell 210 (220) receives $A_1$ and $A_3$ using NMOS (PMOS) transistors 211 (221) and 212 (222) respectively, and mixes with $B_1$ and $B_3$ using NMOS (PMOS) transistors 213 (223), 214 (224), 215 (225), and 216 (226), resulting in a first (second) current pair $I_n$ ($I_{21}$) and $I_{12}$ ($I_{22}$). The second N-type (P-type) Gilbert cell 230 (240) receives $A_2$ and $A_4$ using NMOS (PMOS) transistors 231 (241) and 232 (242) respectively, and mixes with $B_2$ and $B_4$ using NMOS (PMOS) transistors 233 (243), 234 (244), 235 (245), and 236 (246), resulting in a third (fourth) current pair $I_{31}$ ($I_{41}$) and $I_{32}$ ($I_{42}$). $I_{11}$, $I_{21}$, $I_{32}$, and $I_{42}$ are summed at a first node 201, resulting in $V_1$, while $I_{12}$, $I_{22}$, $I_{31}$, and $I_{41}$ are summed at a second node 202, resulting in $V_2$. The cross-coupling inverter pair 260 is configured to provide a cross coupling between $V_1$ and $V_2$.

In an embodiment, the first signal A and the second signal B can be mathematically modeled by the following two equations:

$$A_i = V_{CMA} + V_{AA}\cos\left(2\pi f_1 t + \frac{(i-1)\pi}{2}\right) \text{ for } i = 1, 2, 3, 4 \quad (1)$$

$$B_i = V_{CMB} + V_{AB}\cos\left(2\pi f_2 t + \frac{(i-1)\pi}{2}\right) \text{ for } i = 1, 2, 3, 4 \quad (2)$$

Here, t denotes a time variable, $V_{CMA}$ is a first common-mode voltage, $V_{AA}$ is a first amplitude, $f_1$ is a first frequency, $V_{CMB}$ is a second common-mode voltage, $V_{AB}$ is a second amplitude, and $f_2$ is a second frequency. Equations (1) and (2) model the first signal A and the second signal B as sinusoidal waves.

In an alternative embodiment, the first signal A and the second signal B can be mathematically modeled by the following two equations:

$$A_i = V_{CMA} + V_{AA} \cdot \text{sign}\left(\cos\left(2\pi f_1 t + \frac{(i-1)\pi}{2}\right)\right) \text{ for } i = 1, 2, 3, 4 \quad (3)$$

$$B_i = V_{CMB} + V_{AB} \cdot \text{sign}\left(\cos\left(2\pi f_2 t + \frac{(i-1)\pi}{2}\right)\right) \text{ for } i = 1, 2, 3, 4 \quad (4)$$

Here, sign(·) denotes a sign function that outputs 1 when its argument is positive and outputs −1 when its argument is negative. Equations (3) and (4) model the first signal A and the second signal B as square waves.

$I_{11}$ and $I_{21}$ are approximately proportional to $\cos(2\pi f_1 t)$ $\cos(2\pi f_2 t)$, while $I_{31}$ and $I_{41}$ are approximately proportional to $\sin(2\pi f_1 t) \sin(2\pi f_2 t)$. $V_1$ is approximately proportional to $\cos(2\pi f_1 t) \cos(2\pi f_2 t) - \sin(2\pi f_1 t) \sin(2\pi f_2 t)$, which is equal to $\cos(2\pi (f_1+f_2)t)$. $V_2$ is an inversion of $V_1$.

Figure 1:
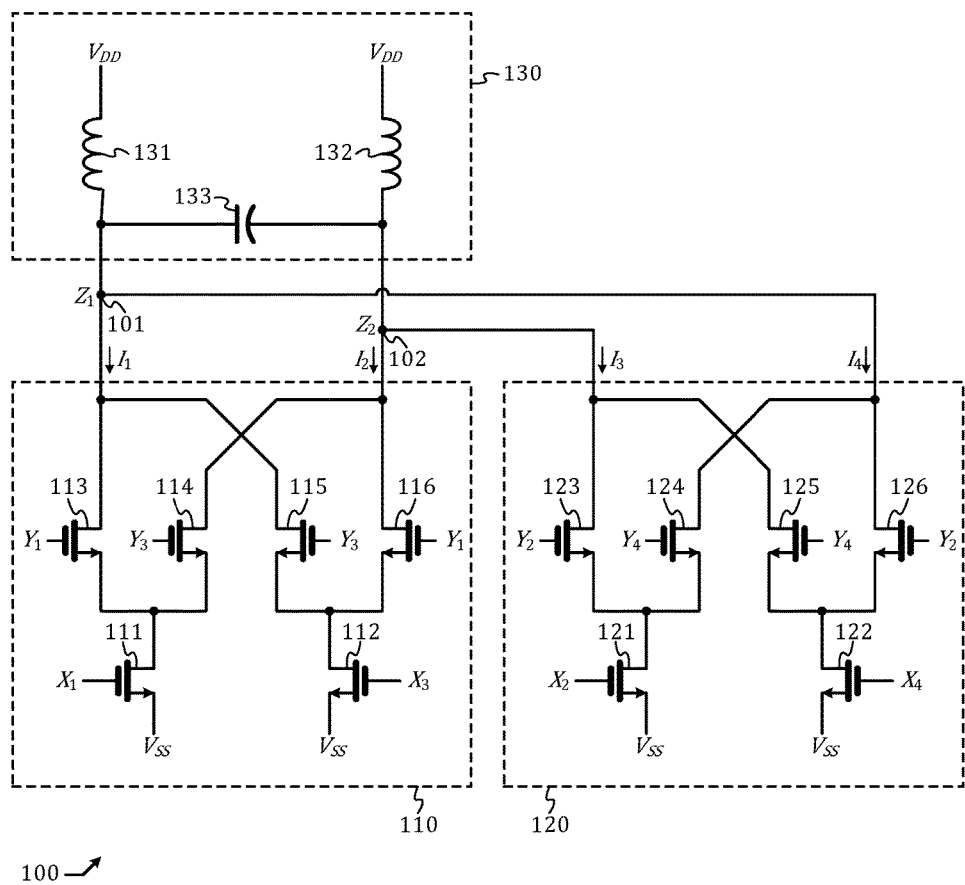
FIG. 1 shows a schematic diagram of a prior art single sideband mixer

A major difference between SSB mixer 200A and the prior art SSB mixer 100 of FIG. 1 is: the two P-type Gilbert cells 220 and 240 are added to complement the two N-type Gilbert cells 210 and 230, respectively. Another difference is that, the cross-coupling inverter pair 260 is added to fulfill two purposes: providing a gain enhancement and establishing a common-mode level for the third signal V (which is a two-phase signal comprising $V_1$ and $V_2$). A cross-coupling inverter pair, such as the cross-coupling inverter pair 260, can provide a positive feedback and thus enhance a gain. A common-mode level of a cross-coupling inverter pair, such as the cross-coupling inverter pair 260, is equal to a trip point of the inverter pair. Load 250 is configured to form a resonant network (across the first node 201 and the second node 202) that resonates at $f_1+f_2$.

By way of example but not limitation: SSB mixer 200 is fabricated using a 28 nm CMOS process; $V_{DD}$ is 1V; $V_{SS}$ is 0V; $f_1$ is 4 GHz; $f_2$ is 8 GHz; $V_{CMA}$ is 0.5V; $V_{CMB}$ is 0.5V; $V_{AA}$ is 0.5V; $V_{AB}$ is 0.5V; the width and length are 1.8 μm and 30 nm, respectively, for NMOS transistors 211, 212, 213, 214, 215, 216, 231, 232, 233, 234, 235, and 236; the width and length are 2.34 μm and 30 nm, respectively, for PMOS transistors 221, 222, 223, 224, 225, 226, 241, 242, 243, 244, 245, and 246; the width and length are 0.6 μm and 30 nm, respectively, for NMOS transistors 261 and 263; the width and length are 0.78 μm and 30 nm, respectively, for PMOS transistors 262 and 264; inductor 251 is 1 nH; and capacitor 252 is 164 fF. The common-mode voltage of the third signal V is approximately 0.5V. Due to using the complementary topology, the common-mode voltage of the third signal V is approximately at a midpoint between $V_{DD}$ and $V_{SS}$. SSB mixer 200A thus resolves the reliability issue and the common-mode issue of SSB 100 of FIG. 1.

Figure 2B:
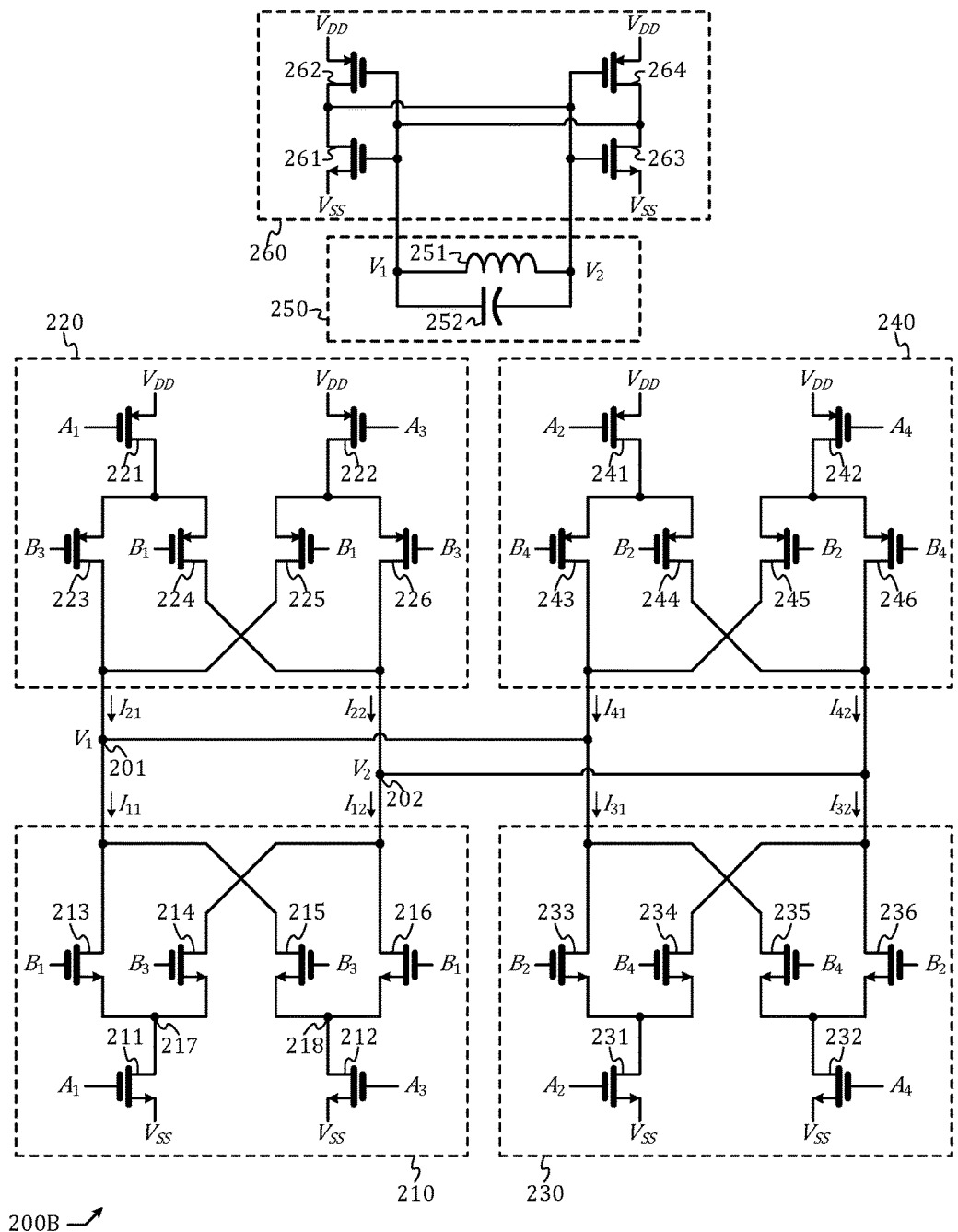
FIG. 2B shows a schematic diagram of a single sideband mixer in accordance with an alternative embodiment of the present invention.

A schematic diagram of another SSB mixer 200B is depicted in FIG. 2B. SSB mixer 200B is the same as SSB mixer 200A of FIG. 2A in circuit topology except that $I_{31}$ and $I_{41}$ are summed with $I_{11}$ and $I_{21}$ (instead of with $I_{12}$ and $I_{22}$) at the first node 201, while $I_{32}$ and $I_{42}$ are summed with $I_{12}$ and $I_{22}$ (instead of with $I_{11}$ and $I_{21}$) at the second node 202. Due to the difference, $V_1$ is approximately proportional to $\cos(2\pi f_1 t)\cos(2\pi f_2 t)+\sin(2\pi f_1 t)\sin(2\pi f_2 t)$, which is equal to $\cos(2\pi(f_1\ f_2)t)$. $V_2$ is an inversion of $V_1$. In this embodiment, load 250 is configured to form a resonant network (across the first node 201 and the second node 202) that resonates at $f_1-f_2$, instead of $f_1+f_2$.

Figure 3:
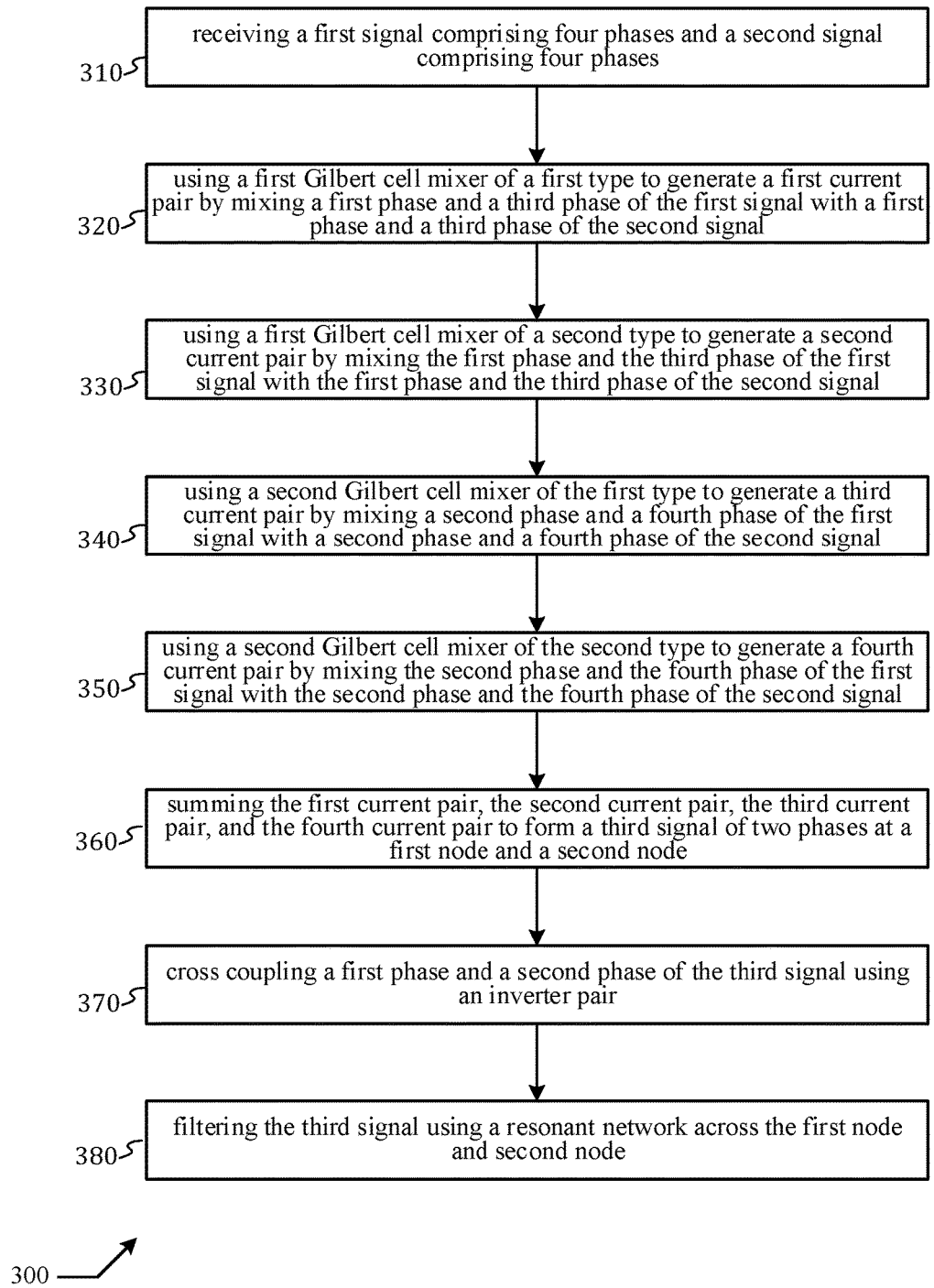
FIG. 3 shows a flow diagram of a method in accordance with an embodiment of the present invention.

As illustrated by a flow diagram 300 shown in FIG. 3, a method in accordance with an embodiment of the present invention comprises: (step 310) receiving a first signal comprising four phases and a second signal comprising four phases; (step 320) using a first Gilbert cell mixer of a first type to generate a first current pair by mixing a first phase and a third phase of the first signal with a first phase and a third phase of the second signal; (step 330) using a first Gilbert cell mixer of a second type to generate a second current pair by mixing the first phase and the third phase of the first signal with the first phase and the third phase of the second signal; (step 340) using a second Gilbert cell mixer of the first type to generate a third current pair by mixing a second phase and a fourth phase of the first signal with a second phase and a fourth phase of the second signal; (step 350) using a second Gilbert cell mixer of the second type to generate a fourth current pair by mixing the second phase and the fourth phase of the first signal with the second phase and the fourth phase of the second signal; (step 360) summing the first current pair, the second current pair, the third current pair, and the fourth current pair to form a third signal of two phases at a first node and a second node; (step 370) cross coupling a first phase and a second phase of the third signal using an inverter pair; and (step 380) filtering the third signal using a resonant network across the first node and second node.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A circuit comprising:
   a first Gilbert cell mixer of a first type configured to receive a first phase and a third phase of a first signal and a first phase and a third phase of a second signal and output a first current pair to a first node and a second node;
   a first Gilbert cell mixer of a second type configured to receive the first phase and the third phase of the first signal and the first phase and the third phase of the second signal and output a second current pair to the first node and the second node;
   a second Gilbert cell mixer of the first type configured to receive a second phase and a fourth phase of the first signal and a second phase and a fourth phase of the second signal and output a third current pair to the first node and the second node;
   a second Gilbert cell mixer of the second type configured to receive the second phase and the fourth phase of the first signal and the second phase and the fourth phase of the second signal and output a fourth current pair to the first node and the second node;
   a cross-coupling inverter pair configured to cross couple the first node and the second node; and
   a load placed across the first node and the second node and configured to resonate at a frequency approximately equal to either a sum of a frequency of the first signal and a frequency of the second signal or a difference of the frequency of the first signal and the frequency of the second signal.

2. The circuit of claim 1, wherein the load comprises a parallel connection of an inductor and a capacitor.

3. The circuit of claim 1, wherein the first Gilbert cell of the first type comprises: a first NMOS (n-channel metal oxide semiconductor) transistor and a second NMOS transistor configured to receive the first phase and the third phase of the first signal, respectively; a third NMOS transistor configured to conditionally provide a current conduction path between an output of the first NMOS transistor and the first node in accordance with the first phase of the second signal; a fourth NMOS transistor configured to conditionally provide a current conduction path between the output of the first NMOS transistor and the second node in accordance with the third phase of the second signal; a fifth NMOS transistor configured to conditionally provide a current conduction path between an output of the second NMOS transistor and the first node in accordance with the third phase of the second signal; and a sixth NMOS transistor configured to conditionally provide a current conduction path between the output of the second NMOS transistor and the second node in accordance with the first phase of the second signal.

4. The circuit of claim 1, wherein the first Gilbert cell of the second type comprises: a first PMOS (p-channel metal oxide semiconductor) transistor and a second PMOS transistor configured to receive the first phase and the third phase of the first signal, respectively; a third PMOS transistor configured to conditionally provide a current conduction path between an output of the first PMOS transistor and the first node in accordance with the third phase of the second signal; a fourth PMOS transistor configured to conditionally provide a current conduction path between the output of the first PMOS transistor and the second node in accordance with the first phase of the second signal; a fifth PMOS transistor configured to conditionally provide a current conduction path between an output of the second PMOS transistor and the first node in accordance with the first phase of the second signal; and a sixth PMOS transistor configured to conditionally provide a current conduction path between the output of the second PMOS transistor and the second node in accordance with the third phase of the second signal.

5. The circuit of claim 1, wherein the second Gilbert cell of the first type comprises: a first NMOS (n-channel metal oxide semiconductor) transistor and a second NMOS transistor configured to receive the second phase and the fourth phase of the first signal, respectively; a third NMOS transistor configured to conditionally provide a current conduction path between an output of the first NMOS transistor and the second node in accordance with the second phase of the second signal; a fourth NMOS transistor configured to conditionally provide a current conduction path between the output of the first NMOS transistor and the first node in accordance with the fourth phase of the second signal; a fifth NMOS transistor configured to conditionally provide a current conduction path between an output of the second NMOS transistor and the second node in accordance with the fourth phase of the second signal; and a sixth NMOS transistor configured to conditionally provide a current conduction path between the output of the second NMOS transistor and the first node in accordance with the second phase of the second signal.

6. The circuit of claim 1, wherein the second Gilbert cell of the second type comprises: a first PMOS (p-channel metal oxide semiconductor) transistor and a second PMOS transistor configured to receive the second phase and the fourth phase of the first signal, respectively; a third PMOS transistor configured to conditionally provide a current conduction path between an output of the first PMOS transistor and the second node in accordance with the fourth phase of the second signal; a fourth PMOS transistor configured to conditionally provide a current conduction path between the output of the first PMOS transistor and the first node in accordance with the second phase of the second signal; a fifth PMOS transistor configured to conditionally provide a current conduction path between an output of the second PMOS transistor and the second node in accordance with the second phase of the second signal; and a sixth PMOS transistor configured to conditionally provide a current conduction path between the output of the second PMOS transistor and the first node in accordance with the fourth phase of the second signal.

7. The circuit of claim 1, wherein the second Gilbert cell of the first type comprises: a first NMOS (n-channel metal oxide semiconductor) transistor and a second NMOS transistor configured to receive the second phase and the fourth phase of the first signal, respectively; a third NMOS transistor configured to conditionally provide a current conduction path between an output of the first NMOS transistor and the second node in accordance with the fourth phase of the second signal; a fourth NMOS transistor configured to conditionally provide a current conduction path between the output of the first NMOS transistor and the first node in accordance with the second phase of the second signal; a fifth NMOS transistor configured to conditionally provide a current conduction path between an output of the second NMOS transistor and the second node in accordance with the second phase of the second signal; and a sixth NMOS transistor configured to conditionally provide a current conduction path between the output of the second NMOS transistor and the first node in accordance with the fourth phase of the second signal.

8. The circuit of claim 1, wherein the second Gilbert cell of the second type comprises: a first PMOS (p-channel metal oxide semiconductor) transistor and a second PMOS transistor configured to receive the second phase and the fourth phase of the first signal, respectively; a third PMOS transistor configured to conditionally provide a current conduction path between an output of the first PMOS transistor and the second node in accordance with the second phase of the second signal; a fourth PMOS transistor configured to conditionally provide a current conduction path between the output of the first PMOS transistor and the first node in accordance with the fourth phase of the second signal; a fifth PMOS transistor configured to conditionally provide a current conduction path between an output of the second PMOS transistor and the second node in accordance with the fourth phase of the second signal; and a sixth PMOS transistor configured to conditionally provide a current conduction path between the output of the second PMOS transistor and the first node in accordance with the second phase of the second signal.

9. The circuit of claim 1, wherein the cross-coupling inverter pair comprises a first inverter comprising a first NMOS (n-channel metal oxide semiconductor) transistor and a first PMOS (p-channel metal oxide semiconductor) and a second inverter comprising a second NMOS transistor and a second PMOS transistor.

10. The circuit of claim 1, wherein the first signal is a four-phase signal, the second signal is a four-phase signal, and the third signal is a two-phase signal.

11. A method comprising:
receiving a first signal comprising four phases and a second signal comprising four phases;
using a first Gilbert cell mixer of a first type to generate a first current pair by mixing a first phase and a third phase of the first signal with a first phase and a third phase of the second signal;
using a first Gilbert cell mixer of a second type to generate a second current pair by mixing the first phase and the third phase of the first signal with the first phase and the third phase of the second signal;
using a second Gilbert cell mixer of the first type to generate a third current pair by mixing a second phase and a fourth phase of the first signal with a second phase and a fourth phase of the second signal;
using a second Gilbert cell mixer of the second type to generate a fourth current pair by mixing the second phase and the fourth phase of the first signal with the second phase and the fourth phase of the second signal;
summing the first current pair, the second current pair, the third current pair, and the fourth current pair to form a third signal of two phases at a first node and a second node;
cross coupling a first phase and a second phase of the third signal using an inverter pair; and
filtering the third signal using a resonant network across the first node and second node.

12. The method of claim 11, wherein the filtering the third signal using a resonant network across the first node and second node comprising using a parallel connection of an inductor and a capacitor.

13. The method of claim 12, wherein the resonant network is of a resonant frequency that is equal to either a sum of a frequency of the first signal and a frequency of the second signal or a difference of the frequency of the first signal and the frequency of the second signal.

14. The method of claim 11, wherein the first Gilbert cell of the first type comprises: a first NMOS (n-channel metal oxide semiconductor) transistor and a second NMOS transistor configured to receive the first phase and the third phase of the first signal, respectively; a third NMOS transistor configured to conditionally provide a current conduction path between an output of the first NMOS transistor and the first node in accordance with the first phase of the second signal; a fourth NMOS transistor configured to conditionally provide a current conduction path between the output of the first NMOS transistor and the second node in accordance with the third phase of the second signal; a fifth NMOS transistor configured to conditionally provide a current conduction path between an output of the second NMOS transistor and the first node in accordance with the third phase of the second signal; and a sixth NMOS transistor configured to conditionally provide a current conduction path between the output of the second NMOS transistor and the second node in accordance with the first phase of the second signal.

15. The method of claim 11, wherein the first Gilbert cell of the second type comprises: a first PMOS (p-channel metal oxide semiconductor) transistor and a second PMOS transistor configured to receive the first phase and the third phase of the first signal, respectively; a third PMOS transistor configured to conditionally provide a current conduction path between an output of the first PMOS transistor and the first node in accordance with the third phase of the second signal; a fourth PMOS transistor configured to conditionally provide a current conduction path between the output of the first PMOS transistor and the second node in accordance with the first phase of the second signal; a fifth PMOS transistor configured to conditionally provide a current conduction path between an output of the second PMOS transistor and the first node in accordance with the first phase of the second signal; and a sixth PMOS transistor configured to conditionally provide a current conduction path between the output of the second PMOS transistor and the second node in accordance with the third phase of the second signal.

16. The method of claim 11, wherein the second Gilbert cell of the first type comprises: a first NMOS (n-channel metal oxide semiconductor) transistor and a second NMOS transistor configured to receive the second phase and the fourth phase of the first signal, respectively; a third NMOS transistor configured to conditionally provide a current conduction path between an output of the first NMOS transistor and the second node in accordance with the second phase of the second signal; a fourth NMOS transistor configured to conditionally provide a current conduction path between the output of the first NMOS transistor and the first node in accordance with the fourth phase of the second signal; a fifth NMOS transistor configured to conditionally provide a current conduction path between an output of the second NMOS transistor and the second node in accordance with the fourth phase of the second signal; and a sixth NMOS transistor configured to conditionally provide a current conduction path between the output of the second NMOS transistor and the first node in accordance with the second phase of the second signal.

17. The method of claim 11, wherein the second Gilbert cell of the second type comprises: a first PMOS (p-channel metal oxide semiconductor) transistor and a second PMOS transistor configured to receive the second phase and the fourth phase of the first signal, respectively; a third PMOS transistor configured to conditionally provide a current conduction path between an output of the first PMOS transistor and the second node in accordance with the fourth phase of the second signal; a fourth PMOS transistor configured to conditionally provide a current conduction path between the output of the first PMOS transistor and the first node in accordance with the second phase of the second signal; a fifth PMOS transistor configured to conditionally provide a current conduction path between an output of the second PMOS transistor and the second node in accordance with the second phase of the second signal; and a sixth PMOS transistor configured to conditionally provide a current conduction path between the output of the second PMOS transistor and the first node in accordance with the fourth phase of the second signal.

18. The method of claim 11, wherein the second Gilbert cell of the first type comprises: a first NMOS (n-channel metal oxide semiconductor) transistor and a second NMOS transistor configured to receive the second phase and the fourth phase of the first signal, respectively; a third NMOS transistor configured to conditionally provide a current conduction path between an output of the first NMOS transistor and the second node in accordance with the fourth phase of the second signal; a fourth NMOS transistor configured to conditionally provide a current conduction path between the output of the first NMOS transistor and the first node in accordance with the second phase of the second signal; a fifth NMOS transistor configured to conditionally provide a current conduction path between an output of the second NMOS transistor and the second node in accordance with the second phase of the second signal; and a sixth NMOS transistor configured to conditionally provide a current conduction path between the output of the second NMOS transistor and the first node in accordance with the fourth phase of the second signal.

19. The method of claim 11, wherein the second Gilbert cell of the second type comprises: a first PMOS (p-channel metal oxide semiconductor) transistor and a second PMOS transistor configured to receive the second phase and the fourth phase of the first signal, respectively; a third PMOS transistor configured to conditionally provide a current conduction path between an output of the first PMOS transistor and the second node in accordance with the second phase of the second signal; a fourth PMOS transistor configured to conditionally provide a current conduction path between the output of the first PMOS transistor and the first node in accordance with the fourth phase of the second signal; a fifth PMOS transistor configured to conditionally provide a current conduction path between an output of the second PMOS transistor and the second node in accordance with the fourth phase of the second signal; and a sixth PMOS transistor configured to conditionally provide a current conduction path between the output of the second PMOS transistor and the first node in accordance with the second phase of the second signal.

20. The method of claim 11, wherein the inverter pair comprises a first inverter comprising a first NMOS (n-channel metal oxide semiconductor) transistor and a first PMOS (p-channel metal oxide semiconductor) and a second inverter comprising a second NMOS transistor and a second PMOS transistor.

* * * * *